United States Patent
Calatayud et al.

(10) Patent No.: US 9,703,324 B2
(45) Date of Patent: Jul. 11, 2017

(54) RF ANTENNA PROXIMITY SENSING IN A PLAYBACK DEVICE

(71) Applicant: Sonos, Inc., Santa Barbara, CA (US)

(72) Inventors: Thomas Calatayud, Cambridge, MA (US); Jonathon Reilly, Cambridge, MA (US)

(73) Assignee: Sonos, Inc., Santa Barbara, CA (US)

( * ) Notice: Subject to any disclaimer, the term of this patent is extended or adjusted under 35 U.S.C. 154(b) by 186 days.

(21) Appl. No.: 14/799,323

(22) Filed: Jul. 14, 2015

(65) Prior Publication Data

US 2015/0317122 A1    Nov. 5, 2015

Related U.S. Application Data

(63) Continuation of application No. 14/041,115, filed on Sep. 30, 2013, now Pat. No. 9,223,353.

(51) Int. Cl.
*G06F 1/16* (2006.01)
*G06F 3/16* (2006.01)
(Continued)

(52) U.S. Cl.
CPC .......... *G06F 1/1656* (2013.01); *G06F 1/1684* (2013.01); *G06F 1/1688* (2013.01);
(Continued)

(58) Field of Classification Search
CPC .... G06F 1/1656; G06F 1/1684; G06F 1/1688; G06F 1/1698; G06F 1/182; G06F 1/3231; G06F 1/3265; G06F 3/0304; G06F 3/162; H03K 17/941; H03K 17/955; H03K 2217/94106; H04N 21/44218;
(Continued)

(56) References Cited

U.S. PATENT DOCUMENTS

| 495,525 A | 4/1893 | Seymour |
| 5,440,644 A | 8/1995 | Farinelli et al. |

(Continued)

FOREIGN PATENT DOCUMENTS

| EP | 1389853 A1 | 2/2004 |
| EP | 2194471 A1 | 6/2010 |

(Continued)

OTHER PUBLICATIONS

Notice of Allowance mailed on Oct. 21, 2015, issued in connection with U.S. Appl. No. 14/041,115, filed Sep. 30, 2013, 8 pages.

(Continued)

*Primary Examiner* — Francis M Legasse, Jr.
(74) *Attorney, Agent, or Firm* — McDonnell Boehnen Hulbert & Berghoff LLP

(57) ABSTRACT

An example embodiment includes a playback device comprising a wireless communications interface that includes an RF antenna, a capacitive proximity sensor comprising a grounding plane that is coupled to the RF antenna, one or more processors, and a data storage having stored therein instructions executable by the one or more processors to cause the playback device to perform operations. The operations include detecting that an object is in proximity to the capacitive proximity sensor and responsively preparing the playback device to play back audio.

20 Claims, 12 Drawing Sheets

(51) Int. Cl.
*G06F 1/18* (2006.01)
*G06F 1/32* (2006.01)
*G06F 3/03* (2006.01)
*H04S 7/00* (2006.01)
H03K 17/94 (2006.01)
H03K 17/955 (2006.01)
H04N 21/442 (2011.01)

(52) U.S. Cl.
CPC ............ *G06F 1/1698* (2013.01); *G06F 1/182* (2013.01); *G06F 1/3231* (2013.01); *G06F 1/3265* (2013.01); *G06F 3/0304* (2013.01); *G06F 3/162* (2013.01); *H04S 7/303* (2013.01); H03K 17/941 (2013.01); H03K 17/955 (2013.01); H03K 2217/94106 (2013.01); H04N 21/44218 (2013.01); H04R 2227/003 (2013.01); H04R 2227/005 (2013.01); H04R 2430/01 (2013.01); Y02B 60/1242 (2013.01); Y02B 60/1289 (2013.01)

(58) Field of Classification Search
CPC ........ H04R 2227/003; H04R 2227/005; H04R 2430/01; H04S 7/303
See application file for complete search history.

(56) References Cited

U.S. PATENT DOCUMENTS

| | | |
|---|---|---|
| 5,761,320 A | 6/1998 | Farinelli et al. |
| 5,923,902 A | 7/1999 | Inagaki |
| 6,032,202 A | 2/2000 | Lea et al. |
| 6,044,632 A | 4/2000 | Schmalz et al. |
| 6,256,554 B1 | 7/2001 | DiLorenzo |
| 6,404,811 B1 | 6/2002 | Cvetko et al. |
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,643,744 B1 | 11/2003 | Cheng |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,483,538 B2 | 1/2009 | McCarty et al. |
| 7,571,014 B1 | 8/2009 | Lambourne et al. |
| 7,621,441 B1 | 11/2009 | Milford et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,728,316 B2 | 6/2010 | Fadell et al. |
| 7,840,740 B2 | 11/2010 | Minoo |
| 7,853,341 B2 | 12/2010 | McCarty et al. |
| 7,868,778 B2 | 1/2011 | Kenwright |
| 7,949,707 B2 | 5/2011 | McDowall et al. |
| 7,957,762 B2 | 6/2011 | Herz et al. |
| 7,987,294 B2 | 7/2011 | Bryce et al. |
| 8,014,423 B2 | 9/2011 | Thaler et al. |
| 8,030,914 B2 | 10/2011 | Alameh et al. |
| 8,045,952 B2 | 10/2011 | Qureshey et al. |
| 8,103,009 B2 | 1/2012 | McCarty et al. |
| 8,234,395 B2 | 7/2012 | Millington |
| 8,332,414 B2 | 12/2012 | Nguyen et al. |
| 8,381,135 B2 | 2/2013 | Hotelling et al. |
| 8,452,020 B2 | 5/2013 | Gregg et al. |
| 8,483,853 B1 | 7/2013 | Lambourne |
| 8,577,289 B2 * | 11/2013 | Schlub ............... G01B 7/023 343/702 |
| 8,649,833 B1 | 2/2014 | Lee et al. |
| 9,494,683 B1 | 11/2016 | Sadek |
| 2001/0042107 A1 | 11/2001 | Palm |
| 2001/0043592 A1 | 11/2001 | Jimenez et al. |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty |
| 2004/0024478 A1 | 2/2004 | Hans et al. |
| 2007/0116264 A1 | 5/2007 | Lucey |
| 2007/0142944 A1 | 6/2007 | Goldberg et al. |
| 2008/0109956 A1 | 5/2008 | Bayley et al. |
| 2008/0284738 A1 | 11/2008 | Hovden et al. |
| 2009/0139778 A1 | 6/2009 | Butler et al. |
| 2010/0046766 A1 | 2/2010 | Gregg et al. |
| 2010/0103098 A1 | 4/2010 | Gear et al. |
| 2010/0171027 A1 | 7/2010 | Yun |
| 2011/0087842 A1 | 4/2011 | Lu et al. |
| 2011/0241907 A1 | 10/2011 | Cordeiro |
| 2012/0019165 A1 | 1/2012 | Igaki et al. |
| 2012/0044199 A1 | 2/2012 | Karpin et al. |
| 2012/0050189 A1 | 3/2012 | Choboter et al. |
| 2012/0143357 A1 | 6/2012 | Chemel et al. |
| 2012/0145932 A1 | 6/2012 | Yao et al. |
| 2012/0268145 A1 | 10/2012 | Chandra et al. |
| 2012/0318364 A1 | 12/2012 | Sawaski et al. |
| 2013/0094659 A1 | 4/2013 | Liu |
| 2013/0202132 A1 | 8/2013 | Zurek et al. |
| 2013/0273869 A1 | 10/2013 | Parker et al. |
| 2014/0003629 A1 | 1/2014 | Reilly et al. |
| 2014/0244013 A1 | 8/2014 | Reilly |
| 2015/0199042 A1 * | 7/2015 | Standing ............... G06F 3/044 345/174 |

FOREIGN PATENT DOCUMENTS

| | | |
|---|---|---|
| WO | 0153994 A2 | 7/2001 |
| WO | 2003093950 A2 | 11/2003 |

OTHER PUBLICATIONS

Notice of Allowance mailed on Jun. 21, 2016, issued in connection with U.S. Appl. No. 14/806,922, filed Jul. 23, 2015, 13 pages.
"Denon 2003-2004 Product Catalog," Denon, 2003-2004, 44 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2003, entitled "Controlling and manipulating groupings in a multi-zone music or media system," 82 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
"Notice of Allowance mailed on Jun. 15, 2015, issued in connection with U.S. Appl. No. 14/041,308, filed Sep. 30, 2013, 8 pages".
"AudioTron Quick Start Guide, Version 1.0", Voyetra Turtle Beach, Inc., Mar. 2001, 24 pages.
"AudioTron Reference Manual, Version 3.0", Voyetra Turtle Beach, Inc., May 2002, 70 pages.
"AudioTron Setup Guide, Version 3.0", Voyetra Turtle Beach, Inc., May 2002, 38 pages.
"Bluetooth. "Specification of the Bluetooth System: The ad hoc SCATTERNET for affordable and highly functional wireless connectivity" Core, Version 1.0 A, Jul. 26, 1999, 1068 pages".
"Bluetooth. "Specification of the Bluetooth System: Wireless connections made easy" Core, Version 1.0 B, Dec. 1, 1999, 1076 pages".
Camacho; Oscar et al., "Designing Touch Sensing Electrodes: Electrical Considerations and Recommended Layout Patterns", Freescale Semiconductor, 2010, 28 pages.
"Dell, Inc. "Dell Digital Audio Receiver: Reference Guide" Jun. 2000, 70 pages".
"Dell, Inc. "Start Here" Jun. 2000, 2 pages".
"Extended Range Proximity with SMSC RightTouch Capacitive Sensors", Nov. 7, 2012, 11 pages.
"Si114X Designer'S Guide", 2012, 58 pages.

(56) References Cited

OTHER PUBLICATIONS

Jo J., et al., "Synchronized One-to-many Media Streaming with Adaptive Playout Control," Proceedings of SPIE, 2002, vol. 4861, pp. 71-82.
"Jones, Stephen. "Dell Digital Audio Receiver: Digital upgrade for your analog stereo" Analog Stereo. Jun. 24, 2000 retrieved Jun. 18, 2014, 2 pages".
"Louderback, Jim. "Affordable Audio Receiver Furnishes Homes With MP3" TechTV Vault. Jun. 28, 2000 retrieved Jul. 10, 2014, 2 pages".
"Non-Final Office Action mailed on May 2015, issued in connection with U.S. Appl. No. 14/041,115, filed Sep. 30, 2013, 14 pages".
"Palm, Inc. "Handbook for the Palm VII Handheld" May 2000, 311 pages".
"Presentations at WinHEC 2000" May 2000, 138 pages.
"UPnP; "Universal Plug and Play Device Architecture"; Jun. 8, 2000; version 1.0; Microsoft Corporation; pp. 1-54".
Gao; Xiang, "Microchip Capacitive Proximity Design Guide", 2013, 8 pages.

\* cited by examiner

RF ANTENNA PROXIMITY SENSING IN A PLAYBACK DEVICE

CROSS-REFERENCE TO RELATED APPLICATIONS

This application is a continuation of U.S. patent application Ser. No. 14/041,115, filed on Sep. 30, 2013, entitled "Proximity Sensing Configuration," which is incorporated herein by reference in its entirety.

FIELD OF THE DISCLOSURE

The disclosure is related to consumer goods and, more particularly, to methods, systems, products, features, services, and other items directed to media playback or some aspect thereof.

BACKGROUND

Digital music has become readily available due in part to the development of consumer level technology that has allowed people to listen to digital music on a personal audio device. The consumer's increasing preference for digital audio has also resulted in the integration of personal audio devices into PDAs, cellular phones, and other mobile devices. The portability of these mobile devices has enabled people to take the music listening experience with them and outside of the home. People have become able to consume digital music, like digital music files or even Internet radio, in the home through the use of their computer or similar devices. Now there are many different ways to consume digital music, in addition to other digital content including digital video and photos, stimulated in many ways by high-speed Internet access at home, mobile broadband Internet access, and the consumer's hunger for digital media.

Until recently, options for accessing and listening to digital audio in an out-loud setting were severely limited. In 2005, Sonos offered for sale its first digital audio system that enabled people to, among many other things, access virtually unlimited sources of audio via one or more networked connected zone players, dynamically group or ungroup zone players upon command, wirelessly send the audio over a local network amongst zone players, and play the digital audio out loud across multiple zone players in synchrony. The Sonos system can be controlled by software applications running on network capable mobile devices and computers.

Given the insatiable appetite of consumers towards digital media, there continues to be a need to develop consumer technology that revolutionizes the way people access and consume digital media.

BRIEF DESCRIPTION OF THE DRAWINGS

Features, aspects, and advantages of the presently disclosed technology may be better understood with regard to the following description, appended claims, and accompanying drawings where:

Figure 1:
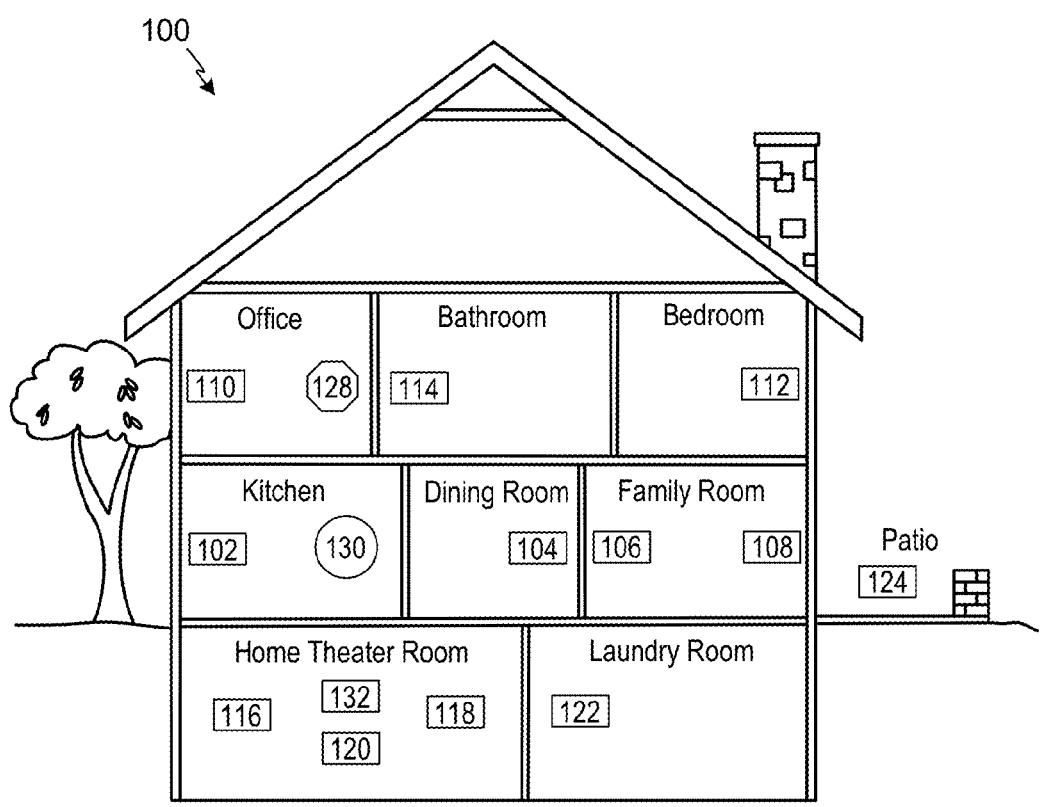
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

Embodiments described herein involve intelligently revealing selectable icons on a control panel of a playback device based on proximity detection, and further involve configurations of capacitive proximity sensors for detecting physical movement within a wider proximal range of the playback device.

In one example, the control panel of the playback device may include one or more back-lit icons or buttons selectable by a user to control functions of the playback device. In some cases, such as for purposes of energy conservation or room-ambience preservation, the icons may be configured to remain dark or dimmed by default, and illuminated when a determination has been made that a user may wish to view and potentially select the icon. As such, illumination of the icons may be based on a proximity detection of the user approaching the playback device.

A proximity sensor module of the playback device may be configured to detect physical movement or presence such as that of the user, within a proximal range of the playback device. The icons may then be illuminated based on a detection of the physical movement or presence. The proximity sensor module may include one or more different types of sensors, such as a capacitive sensors, infrared (IR) sensors, and photo-sensors. Other types of sensors are also possible.

In one example, the proximity sensor module may include a capacitive sensor configured to detect a change in capacitance near the control panel of the playback device. In some cases however, such as if the playback device is located near a plasma television, the capacitive sensor may be falsely triggered while the plasma television is on. In one example, a gain of the capacitive sensor may be reduced in the presence of the plasma television to reduce false triggers. However, a reduced capacitive sensor gain may result in signals indicating the physical movement becoming indistinguishable from a baseline noise signal for the capacitive sensor. Additional signal processing may be performed to better distinguish the signals, but may result in slower response times.

In another example, the proximity sensor module may include an IR sensor configured to detect reflected infrared light pulses. In some cases however, if the ambient light level of the playback device is high, the IR sensor may be flooded by the high ambient light level such that the IR sensor may not be able to reliably discern the reflected light pulses from the baseline ambient light.

In one embodiment of the present application, the proximity sensor module may include both a capacitive sensor and an IR sensor configured to complimentarily detect physical movement or presence, with reduced false triggers and improved detection. In one example, respective sensitivities of the capacitive sensor and the IR sensor may be adjusted based on the ambient light level around the playback device. For instance, an ambient light sensor, which may be the IR sensor and/or another type of sensor, may be configured to determine the ambient light level.

For the IR sensor, if the ambient light level is high, a dynamic range of the IR sensor may be reduced, and a pulse width of infrared light pulses generated from the IR sensor may be lengthened. On the other hand, if the ambient light level is low, the dynamic range of the IR sensor may be increased, and the pulse width of infrared light pulses may be shortened. For the capacitive sensor, if the ambient light level is high, a gain of the capacitive sensor may be increased, and if the ambient light level is low, the gain of the capacitive sensor may be reduced. In one example, different combinations of IR sensor dynamic ranges and infrared light pulse widths may be configured for different levels of ambient light, and different capacitive sensor gain levels may be configured for different levels of ambient light.

In combination, when the ambient light level is high, the capacitive sensor may become more sensitive due to the increased gain level, while the IR sensor may become less sensitive due to the reduced dynamic range and increased infrared light pulse width. On the other hand, when the ambient light level is low, the capacitive sensor may become less sensitive due to the decreased gain level, while the IR sensor may become more sensitive due to the increased dynamic range and shorted infrared light pulse widths. As indicated above, different configurations of IR sensor and capacitive sensor sensitivities may be implemented for different levels of ambient light. Based on this example embodiment, the back-lit icons on the control panel of the playback device may be illuminated when either the IR sensor or the capacitive sensor detects the physical movement or presence of the user within the proximal range of the playback device.

The capacitive sensor may also compliment the IR sensor by providing additional off-axis detections. For instance, the IR sensor may be positioned along a top side of the playback device and accordingly, may have a detection range limited to space above the playback device. In this case, an approach of the user from the front side of the playback device may not be detected by the IR sensor. The capacitive sensor however, may be less directional and may provide detection of physical movement from the front side of the playback device, even if the capacitive sensor is positioned along the top side of the playback device as well.

In some embodiments of the present application, the off-axis, or zero-degree approach detection by capacitive sensors may further be improved by coupling an antenna of the capacitive sensor to other components of the playback device. In one example, the playback device may be configured to communicate via wireless communication and may include an RF antenna component. In one case, an RF antenna ground plane of the RF antenna component may be oriented orthogonally to the capacitive sensor, and coupling the antenna of the capacitive sensor to the RF antenna ground plane may provide detection in an axial direction orthogonal to the axial direction of the capacitive sensor. In the case the capacitive sensor is positioned along the top surface of the playback device, the axial direction of the capacitive sensor may be directed to the space above the playback device. In this case, if the RF antenna ground is along the front surface of the playback device, the orthogonal axial direction provided by coupling the antenna of the capacitive sensor to the RF antenna ground may be directed to the space in front of the playback device. Accordingly, the capacitive sensor may provide improved detection of physical movement in the space in front of the playback device.

In some cases, the playback device may include a speaker grille covering the front surface of the playback device. Similar to the RF antenna component, the speaker grille may also be coupled to the antenna of the capacitive sensor, thereby providing improved detection of physical movement in the space in front of the playback device. In some cases however, playback of audio by the playback device may generate sufficient change in capacitance detected by the speaker grille and cause false triggers. As such, in one embodiment, the speaker grille and the antenna of the capacitive sensor may be coupled when the playback device is not playing audio content, and decoupled when the playback device is playing audio content.

While the discussions above are directed to proximity detection for the purposes of revealing icons or buttons on the control panel of the playback device, one having ordinary skill in the art will appreciate that proximity detection may be utilized in other capacities as well. For instance, a playback device may pre-cache audio content in anticipation of a user providing input via the control panel to cause the playback device to playback audio content. In another instance, the playback device may be in an in-active state such that an amplifier of the playback device may be turned off to reduce power consumption while the playback device is not playing audio content. In this instance, the amplifier of the playback device may be turned on in anticipation of a user providing input via the control panel to cause the playback device to playback audio content based on proximity detection. Other examples are also possible.

As indicated above, the present application involves intelligently revealing selectable icons on a control panel of a playback device based on proximity detection. In one aspect, a method is provided. The method involves determining an ambient light level based on a detection by a light sensor of ambient light of a control area for a playback device, and adjusting, based on the ambient light level, a sensitivity of an infrared (IR) proximity sensor. The IR proximity sensor is configured to detect physical movement. The method further involves adjusting, based on the ambient light level, a sensitivity of a capacitive proximity sensor. The capacitive proximity sensor is configured to detect a physical movement. The method also involves determining a physical approach of an entity towards the playback device based on the detection of the physical movement by at least one of the IR proximity sensor and the capacitive proximity sensor, and responsively causing a control area of the playback device to be illuminated.

In another aspect, a device is provided. The device includes a processor, an infrared (IR) proximity sensor, a capacitive proximity sensor, and memory having stored thereon instructions executable by the processor to cause the playback device to perform functions. The functions include determining an ambient light level of a control area for a playback device based on a detection by a light sensor, and adjusting, based on the ambient light level, a sensitivity of an infrared (IR) proximity sensor. The IR proximity sensor is configured to detect physical movement. The functions further include adjusting, based on the ambient light level, a sensitivity of a capacitive proximity sensor. The capacitive proximity sensor is configured to detect a physical movement. The functions further include determining a physical approach of an entity towards the playback device based on the detection of the physical movement by at least one of the IR proximity sensor and the capacitive proximity sensor, and responsively causing a control area of the playback device to be illuminated.

In yet another aspect, a non-transitory computer readable memory is provided. The non-transitory computer readable memory has stored thereon instructions executable by a computing device to cause the computing device to perform functions. The functions include determining an ambient light level of a control area for a playback device based on a detection by a light sensor, and adjusting, based on the ambient light level, a sensitivity of an infrared (IR) proximity sensor. The IR proximity sensor is configured to detect physical movement. The functions also include adjusting, based on the ambient light level, a sensitivity of a capacitive proximity sensor. The capacitive proximity sensor is configured to detect a physical movement. The functions further include determining a physical approach of an entity towards the playback device based on the detection of the physical movement by at least one of the IR proximity sensor and the capacitive proximity sensor, and responsively causing a control area of the playback device to be illuminated.

Other embodiments, as those discussed in the following and others as can be appreciated by one having ordinary skill in the art are also possible.

II. Example Operating Environment

Referring now to the drawings, in which like numerals can refer to like parts throughout the figures, FIG. 1 shows an example media system configuration 100 in which one or more embodiments disclosed herein can be practiced or implemented.

By way of illustration, the media system configuration 100 is associated with a home having multiple zones, although it should be understood that the home could be configured with only one zone. Additionally, one or more zones can be added to the configuration 100 over time. Each zone may be assigned by a user to a different room or space, such as, for example, an office, bathroom, bedroom, kitchen, dining room, family room, home theater room, utility or laundry room, and patio. A single zone might also include multiple rooms or spaces if so configured. With respect to FIG. 1, one or more of zone players 102-124 are shown in each respective zone. Zone players 102-124, also referred to herein as playback devices, multimedia units, speakers, players, and so on, provide audio, video, and/or audiovisual output. A controller 130 (e.g., shown in the kitchen for purposes of this illustration) provides control to the media system configuration 100. Controller 130 may be fixed to a zone, or alternatively, mobile such that it can be moved about the zones. The media system configuration 100 may also include more than one controller 130, and additional controllers may be added to the system over time.

The media system configuration 100 illustrates an example whole house media system, though it is understood that the technology described herein is not limited to, among other things, its particular place of application or to an expansive system like a whole house media system 100 of FIG. 1.

a. Example Zone Players

Figure 2A:
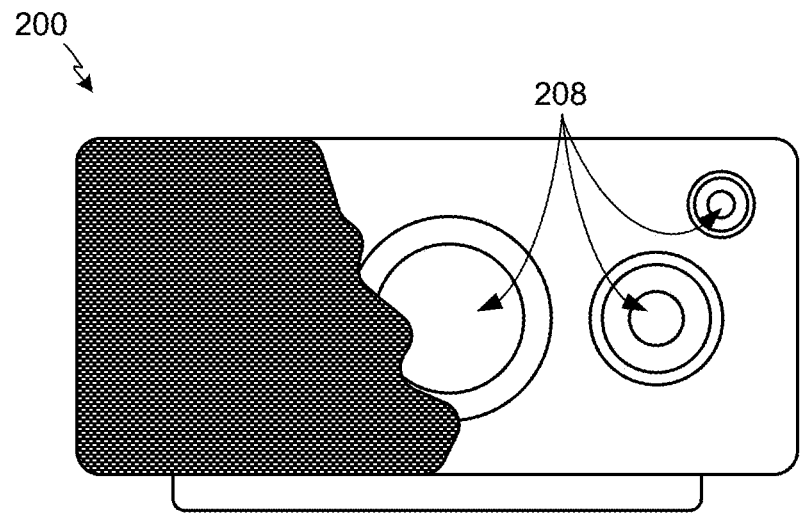
FIG. 2A shows an illustration of an example zone player having a built-in amplifier and transducers.
Figure 2B:
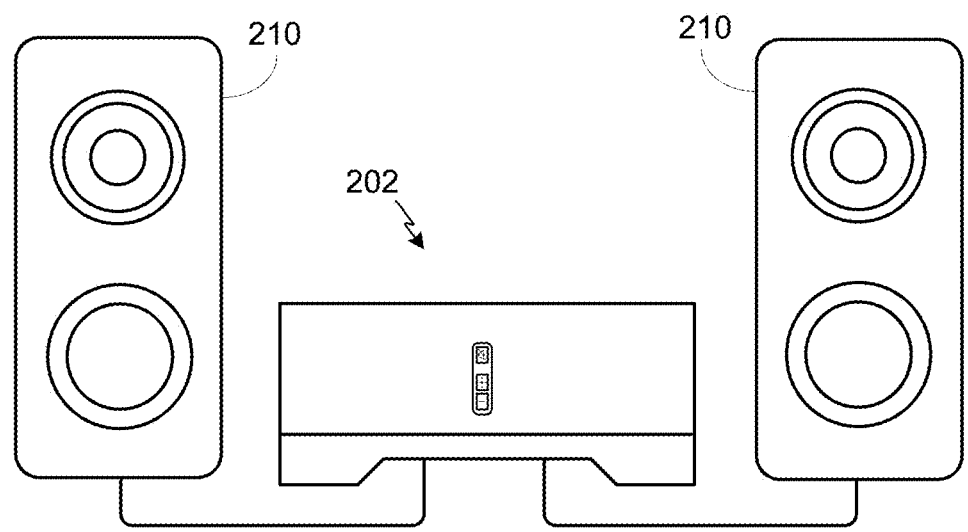
FIG. 2B shows an illustration of an example zone player having a built-in amplifier and connected to external speakers.
Figure 2C:
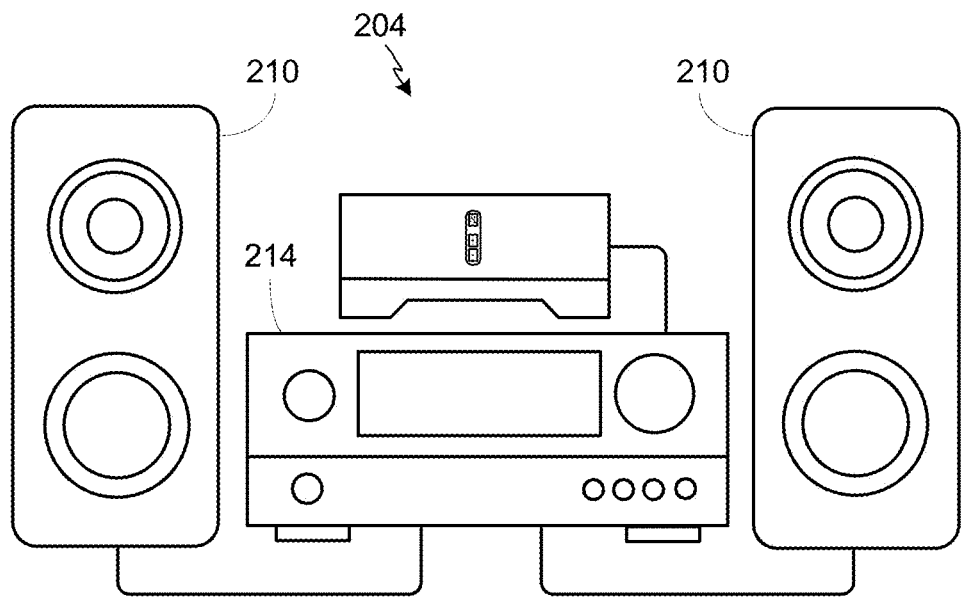
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates a zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more acoustic transducers (e.g., speakers). A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 may be dynamically configured to reproduce a subset of full-range sound, such as when zone player 200 is grouped with other zone players to play stereophonic audio, monaural audio, and/or surround audio or when the media content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a particular zone player in a zone or zone group may be assigned to a playback queue (or "queue"). The playback queue contains information corresponding to zero or more audio items for playback by the associated zone or zone group. The playback queue may be stored in memory on a zone player or some other designated device. Each item contained in the playback queue may comprise a uniform resource identifier (URI) or some other identifier that can be used by the zone player(s) to seek out and/or retrieve the audio items from the identified audio source(s). Depending on the item, the audio source might be found on the Internet (e.g., the cloud), locally from another device over the data network 128 (described further below), from the controller 130, stored on the zone player itself, or from an audio source communicating directly to the zone player. In some embodiments, the zone player can reproduce the audio itself (e.g., play the audio), send the audio to another zone player for reproduction, or both where the audio is reproduced by the zone player as well as one or more additional zone players (possibly in synchrony). In some embodiments, the zone player may play a first audio content (or alternatively, may not play the content at all), while sending a second, different audio content to another zone player(s) for reproduction. To the user, each item in a playback queue is represented on an interface of a controller by an element such as a track name, album name, radio station name, playlist, or other some other representation. A user can populate the playback queue with audio items of interest. The user may also modify and clear the playback queue, if so desired.

By way of illustration, SONOS, Inc. of Santa Barbara, Calif. presently offers for sale zone players referred to as a "PLAY:5," "PLAY:3," "PLAYBAR," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player may include or interact with a docking station for an Apple iPod™ or similar device.

b. Example Controllers

Figure 3:
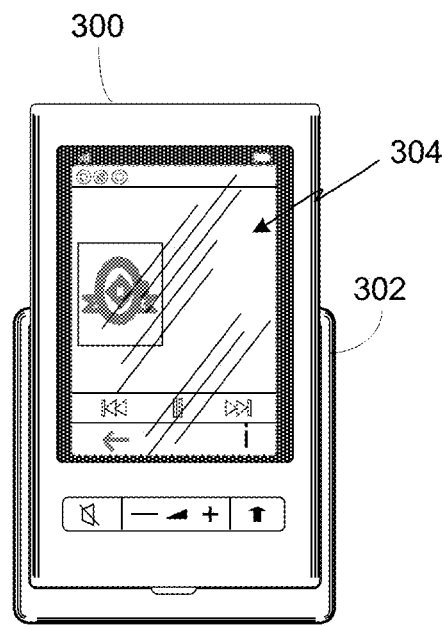
FIG. 3 shows an illustration of an example controller.

FIG. 3 illustrates an example wireless controller 300 in docking station 302. By way of illustration, controller 300 may correspond to controlling device 130 of FIG. 1. Docking station 302, if provided or used, may provide power to the controller 300 and additionally may charge a battery of controller 300. In some embodiments, controller 300 may be provided with a touch screen 304 that allows a user to interact through touch with the controller 300, for example, to retrieve and navigate a playlist of audio items, modify and/or clear the playback queue of one or more zone players, control other operations of one or more zone players, and provide overall control of the system configuration 100. In other embodiments, other input mechanisms such as voice control may be used to interact with the controller 300. In certain embodiments, any number of controllers can be used to control the system configuration 100. In some embodiments, there may be a limit set on the number of controllers that can control the system configuration 100. The controllers might be wireless like wireless controller 300 or wired to data network 128.

In some embodiments, if more than one controller is used in system 100 of FIG. 1, each controller may be coordinated to display common content, and may all be dynamically updated to indicate changes made to the system 100 from a single controller. Coordination can occur, for instance, by a controller periodically requesting a state variable directly or indirectly from one or more of the zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an iPhone™, iPad™, Android™ powered phone or tablet, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by Sonos, Inc. of Santa Barbara, Calif. include a "Controller 200," "SONOS® CONTROL," "SONOS® Controller for iPhone™," "SONOS® Controller for iPad™," "SONOS® Controller for Android™," "SONOS® Controller for Mac™ or PC."

c. Example Data Connection

Zone players 102-124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players are coupled to data network 128 using a centralized access point such as a wired or wireless router. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, a "bonded zone" is a zone that contains two or more zone players, such as the two zone players 106 and 108 in the family room whereby the two zone players 106 and 108 can be configured to play the same audio source in synchrony. In one example, the two zone players 106 and 108 can be paired to play two separate sounds in left and right channels, for example. In other words, the stereo effects of a sound can be reproduced or enhanced through the two zone players 106 and 108, one for the left sound and the other for the right sound. In another example two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player has additional speaker drivers from which sound can be passed. The consolidated zone player can further be paired with a single zone player or yet another consolidated zone player. Each playback device of a consolidated playback device can be set in a consolidated mode, for example.

In certain embodiments, paired or consolidated zone players (also referred to as "bonded zone players") can play audio in synchrony with other zone players in the same or different zones.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and reconnecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for an individual to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, audio on a zone player itself may be accessed and played. In some embodiments, audio on a controller may be accessed via the data network 128 and played. In some embodiments, music from a personal library stored on a computer or networked-attached storage (NAS) may be accessed via the data network 128 and played. In some embodiments, Internet radio stations, shows, and podcasts may be accessed via the data network 128 and played. Music or cloud services that let a user stream and/or download music and audio content may be accessed via the data network 128 and played. Further, music may be obtained from traditional sources, such as a turntable or CD player, via a line-in connection to a zone player, for example. Audio content may also be accessed using a different protocol, such as Airplay™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 may be shared with any of the zone players 102-124 in the audio system 100.

III. Example Zone Players

Figure 4:
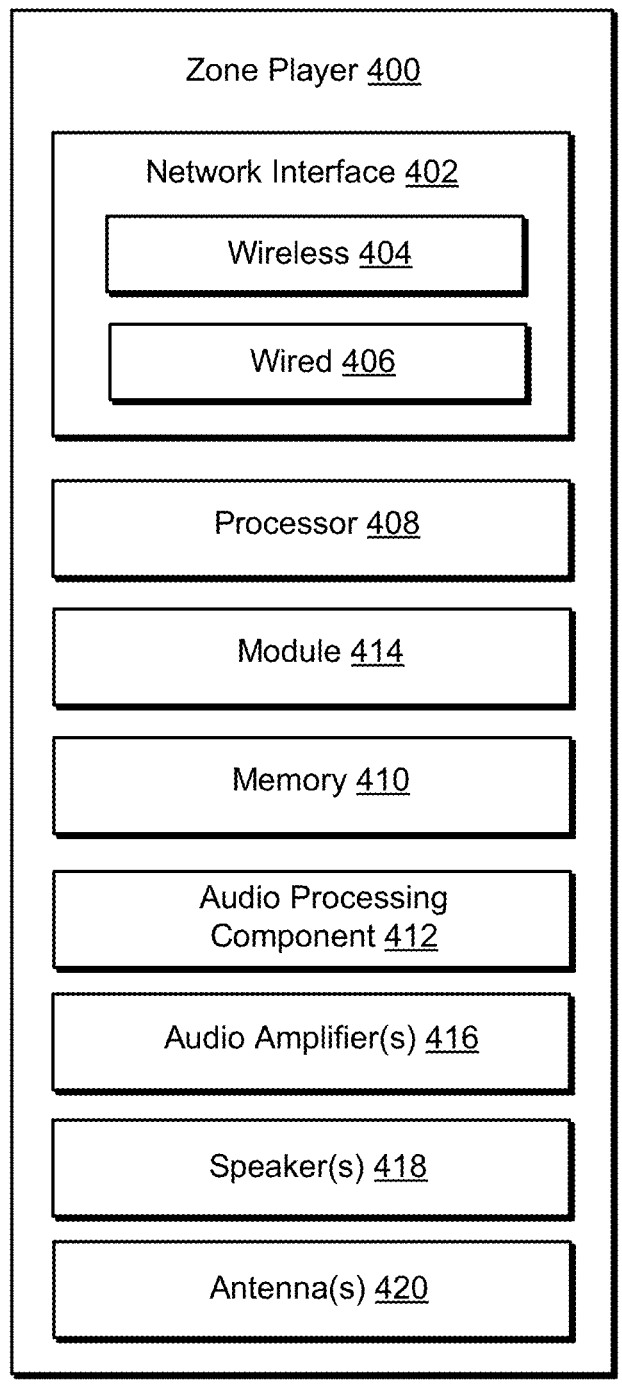
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, 802.11ac, 802.15, 4G mobile communication standard, and so on). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes multiple wireless 404 interfaces. In some embodiments, a zone player includes multiple wired 406 interfaces. In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for playback through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5™, is a zone player with a built-in amplifier and speakers that is capable of retrieving audio directly from the source, such as on the Internet or on the local network, for example. In particular, the PLAY:5™ is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5™.

IV. Example Controller

Figure 5:
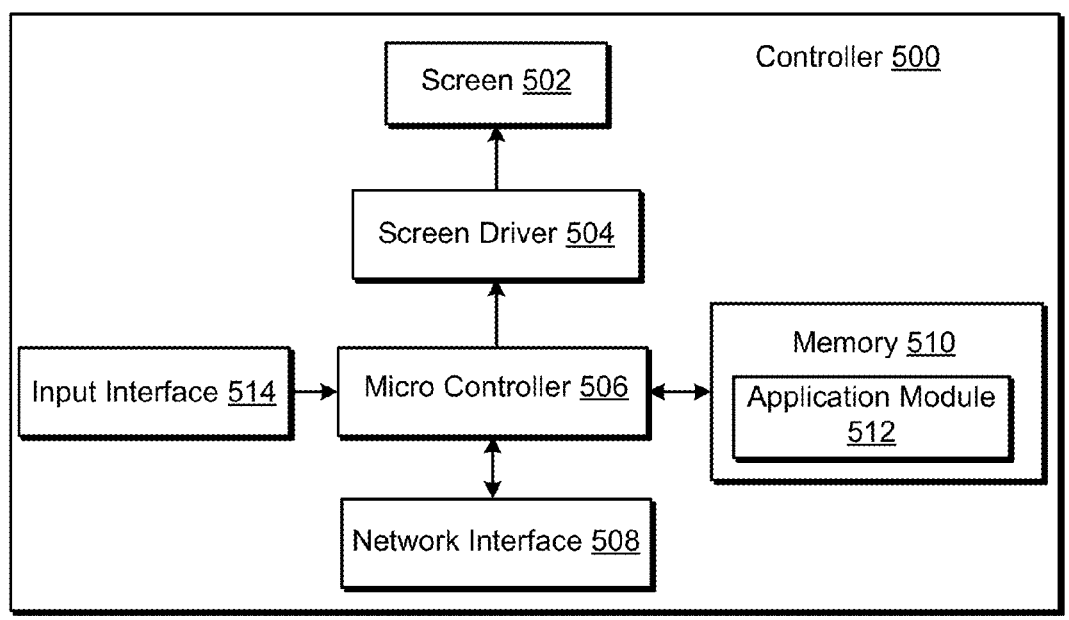
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b, 802.11g, 802.11n, 802.11ac, 802.15, 4G mobile communication standard, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group to facilitate synchronized playback amongst the zone players in the zone group. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an iPhone™, iPad™ or any other smart phone or network-enabled device (e.g., a networked computer such as a PC or Mac™) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group playback an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio playback is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer. In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed or learned action. Other kinds of zone scenes can be programmed or learned by the system over time.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration and revert the zones to their prior configuration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Playback Queue

As discussed above, in some embodiments, a zone player may be assigned to a playback queue identifying zero or more media items for playback by the zone player. The media items identified in a playback queue may be represented to the user via an interface on a controller. For instance, the representation may show the user (or users if more than one controller is connected to the system) how the zone player is traversing the playback queue, such as by highlighting the "now playing" item, graying out the previously played item(s), highlighting the to-be-played item(s), and so on.

In some embodiments, a single zone player is assigned to a playback queue. For example, zone player 114 in the bathroom of FIG. 1 may be linked or assigned to a "Bathroom" playback queue. In an embodiment, the "Bathroom" playback queue might have been established by the system as a result of the user naming the zone player 114 to the bathroom. As such, contents populated and identified in the "Bathroom" playback queue can be played via the zone player 114 (the bathroom zone).

In some embodiments, a zone or zone group is assigned to a playback queue. For example, zone players 106 and 108 in the family room of FIG. 1 may be linked or assigned to a "Family room" playback queue. In another example, if family room and dining room zones were grouped, then the new group would be linked or assigned to a family room+ dining room playback queue. In some embodiments, the family room+dining room playback queue would be established based upon the creation of the group. In some embodiments, upon establishment of the new group, the family room+dining room playback queue can automatically include the contents of one (or both) of the playback queues associated with either the family room or dining room or both. In one instance, if the user started with the family room and added the dining room, then the contents of the family room playback queue would become the contents of the family room+dining room playback queue. In another instance, if the user started with the family room and added the dining room, then the family room playback queue would be renamed to the family room+dining room playback queue. If the new group was "ungrouped," then the family room+dining room playback queue may be removed from the system and/or renamed to one of the zones (e.g., renamed to "family room" or "dining room"). After ungrouping, each of the family room and the dining room will be assigned to a separate playback queue. One or more of the zone players in the zone or zone group may store in memory the associated playback queue.

As such, when zones or zone groups are "grouped" or "ungrouped" dynamically by the user via a controller, the system will, in some embodiments, establish or remove/ rename playback queues respectively, as each zone or zone group is to be assigned to a playback queue. In other words, the playback queue operates as a container that can be populated with media items for playback by the assigned zone. In some embodiments, the media items identified in a playback queue can be manipulated (e.g., re-arranged, added to, deleted from, and so on).

Figure 6:
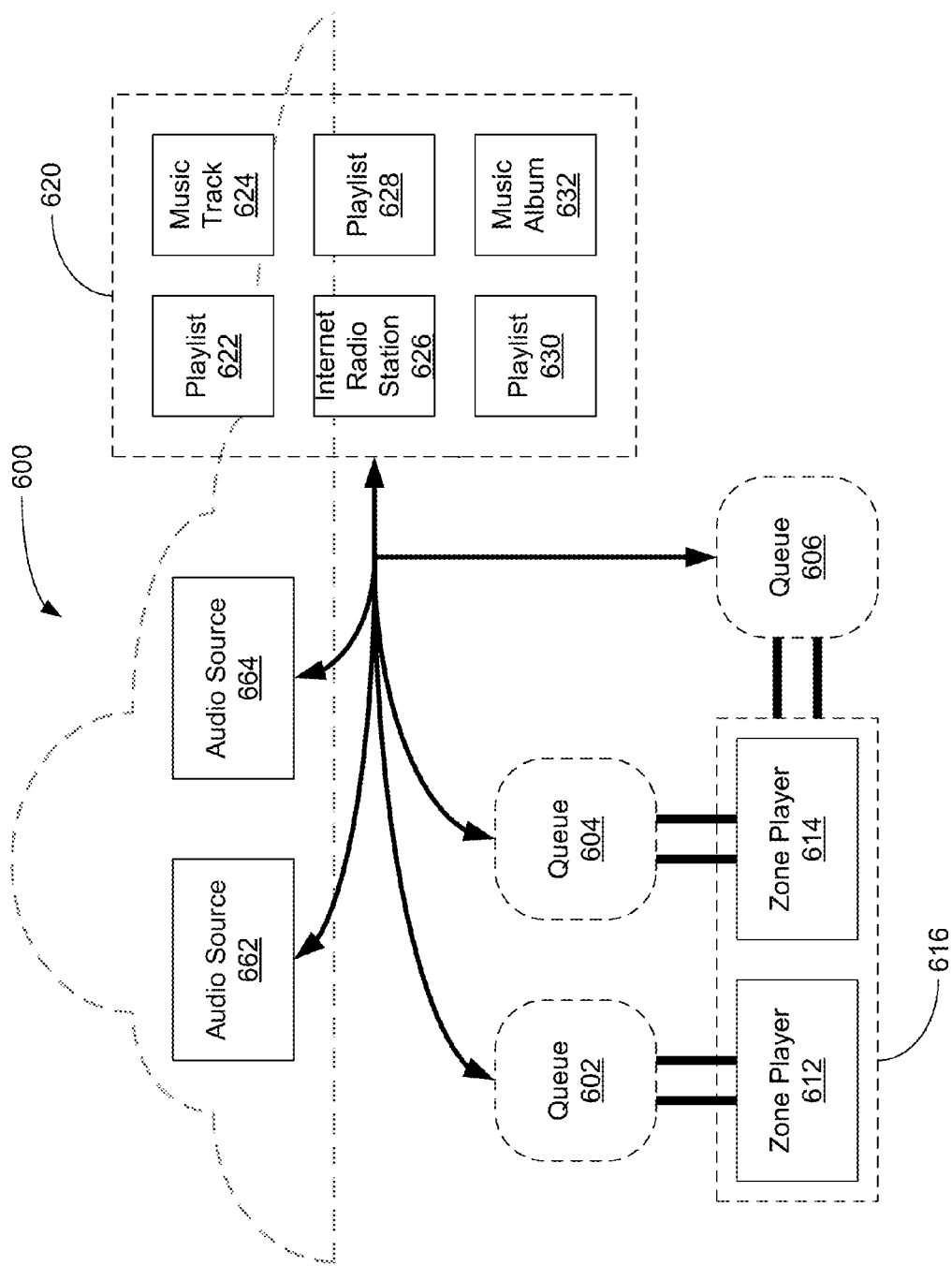
FIG. 6 shows an example playback queue configuration for a network media system.

By way of illustration, FIG. 6 shows an example network 600 for media content playback. As shown, the example network 600 includes example zone players 612 and 614, example audio sources 662 and 664, and example media items 620. The example media items 620 may include playlist 622, music track 624, favorite Internet radio station 626, playlists 628 and 630, and album 632. In one embodiment, the zone players 612 and 614 may be any of the zone players shown in FIGS. 1, 2, and 4. For instance, zone players 612 and 614 may be the zone players 106 and 108 in the Family Room.

In one example, the example audio sources 662 and 664, and example media items 620 may be partially stored on a cloud network, discussed more below in connection to FIG. 8. In some cases, the portions of the audio sources 662, 664, and example media items 620 may be stored locally on one or both of the zone players 612 and 614. In one embodiment, playlist 622, favorite Internet radio station 626, and playlist 630 may be stored locally, and music track 624, playlist 628, and album 632 may be stored on the cloud network.

Each of the example media items 620 may be a list of media items playable by a zone player(s). In one embodiment, the example media items may be a collection of links or pointers (i.e., URI) to the underlying data for media items that are stored elsewhere, such as the audio sources 662 and 664. In another embodiment, the media items may include pointers to media content stored on the local zone player, another zone player over a local network, or a controller device connected to the local network.

As shown, the example network 600 may also include an example queue 602 associated with the zone player 612, and an example queue 604 associated with the zone player 614. Queue 606 may be associated with a group, when in existence, comprising zone players 612 and 614. Queue 606 might comprise a new queue or exist as a renamed version of queue 602 or 604. In some embodiments, in a group, the zone players 612 and 614 would be assigned to queue 606 and queue 602 and 604 would not be available at that time. In some embodiments, when the group is no longer in existence, queue 606 is no longer available. Each zone player and each combination of zone players in a network of zone players, such as those shown in FIG. 1 or that of example zone players 612, 614, and example combination 616, may be uniquely assigned to a corresponding playback queue.

A playback queue, such as playback queues 602-606, may include identification of media content to be played by the corresponding zone player or combination of zone players. As such, media items added to the playback queue are to be played by the corresponding zone player or combination of zone players. The zone player may be configured to play items in the queue according to a specific order (such as an order in which the items were added), in a random order, or in some other order.

The playback queue may include a combination of playlists and other media items added to the queue. In one embodiment, the items in playback queue 602 to be played by the zone player 612 may include items from the audio sources 662, 664, or any of the media items 622-632. The playback queue 602 may also include items stored locally on the zone player 612, or items accessible from the zone player 614. For instance, the playback queue 602 may include Internet radio 626 and album 632 items from audio source 662, and items stored on the zone player 612.

When a media item is added to the queue via an interface of a controller, a link to the item may be added to the queue. In a case of adding a playlist to the queue, links to the media items in the playlist may be provided to the queue. For example, the playback queue 602 may include pointers from the Internet radio 626 and album 632, pointers to items on the audio source 662, and pointers to items on the zone player 612. In another case, a link to the playlist, for example, rather than a link to the media items in the playlist may be provided to the queue, and the zone player or combination of zone players may play the media items in the playlist by accessing the media items via the playlist. For example, the album 632 may include pointers to items stored on audio source 662. Rather than adding links to the items on audio source 662, a link to the album 632 may be added to the playback queue 602, such that the zone player 612 may play the items on the audio source 662 by accessing the items via pointers in the album 632.

In some cases, contents as they exist at a point in time within a playback queue may be stored as a playlist, and subsequently added to the same queue later or added to another queue. For example, contents of the playback queue 602, at a particular point in time, may be saved as a playlist, stored locally on the zone player 612 and/or on the cloud network. The saved playlist may then be added to playback queue 604 to be played by zone player 614.

VI. Example Ad-Hoc Network

Figure 7:
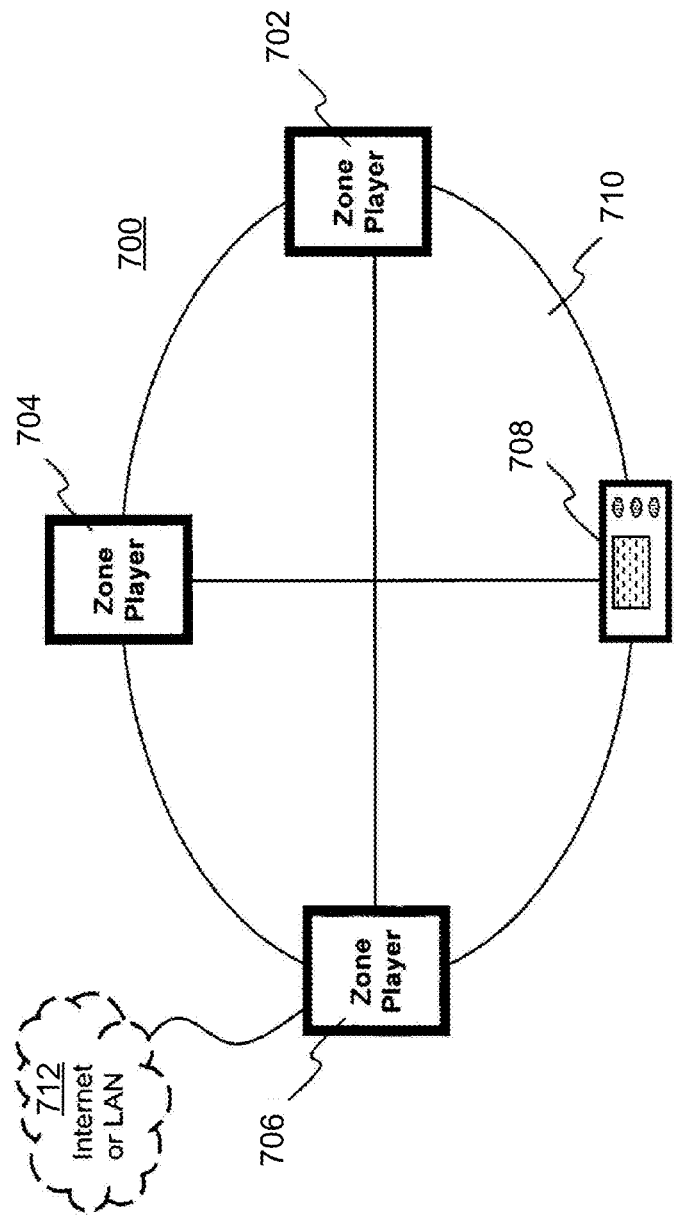
FIG. 7 shows an example ad-hoc playback network.

Particular examples are now provided in connection with FIG. 7 to describe, for purposes of illustration, certain embodiments to provide and facilitate connection to a playback network. FIG. 7 shows that there are three zone players 702, 704 and 706 and a controller 708 that form a network branch that is also referred to as an Ad-Hoc network 710. The network 710 may be wireless, wired, or a combination of wired and wireless technologies. In general, an Ad-Hoc (or "spontaneous") network is a local area network or other small network in which there is generally no one access point for all traffic. With an established Ad-Hoc network 710, the devices 702, 704, 706 and 708 can all communicate with each other in a "peer-to-peer" style of communication, for example. Furthermore, devices may join and/or leave from the network 710, and the network 710 will automatically reconfigure itself without needing the user to reconfigure the network 710. While an Ad-Hoc network is referenced in FIG. 7, it is understood that a playback network may be based on a type of network that is completely or partially different from an Ad-Hoc network.

Using the Ad-Hoc network 710, the devices 702, 704, 706, and 708 can share or exchange one or more audio sources and be dynamically grouped (or ungrouped) to play the same or different audio sources. For example, the devices 702 and 704 are grouped to playback one piece of music, and at the same time, the device 706 plays back another piece of music. In other words, the devices 702, 704, 706 and 708, as shown in FIG. 7, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 710 (or household identifier), though a HOUSEHOLD may be identified with a different area or place.

In certain embodiments, a household identifier (HHID) is a short string or an identifier that is computer-generated to help ensure that it is unique. Accordingly, the network 710 can be characterized by a unique HHID and a unique set of configuration variables or parameters, such as channels (e.g., respective frequency bands), service set identifier (SSID) (a sequence of alphanumeric characters as a name of a wireless network), and WEP keys (wired equivalent privacy) or other security keys. In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., security keys). In an embodiment, the CP also provides the user with a HOUSEHOLD configuration user interface. The CP function can be provided by a computer running a CP application module, or by a handheld controller (e.g., the controller 308) also running a CP application module, for example. The zone player is any other device on the network that is placed to participate in the automatic configuration process. The ZP, as a notation used herein, includes the controller 308 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 706 in FIG. 7 is shown to be connected to both networks, for example. The connectivity to the network 712 is based on Ethernet and/or Wireless, while the connectivity to other devices 702, 704 and 708 is based on Wireless and Ethernet if so desired.

It is understood, however, that in some embodiments each zone player 706, 704, 702 may access the Internet when retrieving media from the cloud (e.g., the Internet) via the bridging device. For example, zone player 702 may contain a uniform resource locator (URL) that specifies an address to a particular audio track in the cloud. Using the URL, the zone player 702 may retrieve the audio track from the cloud, and ultimately play the audio out of one or more zone players.

VII. Another Example System Configuration

Figure 8:
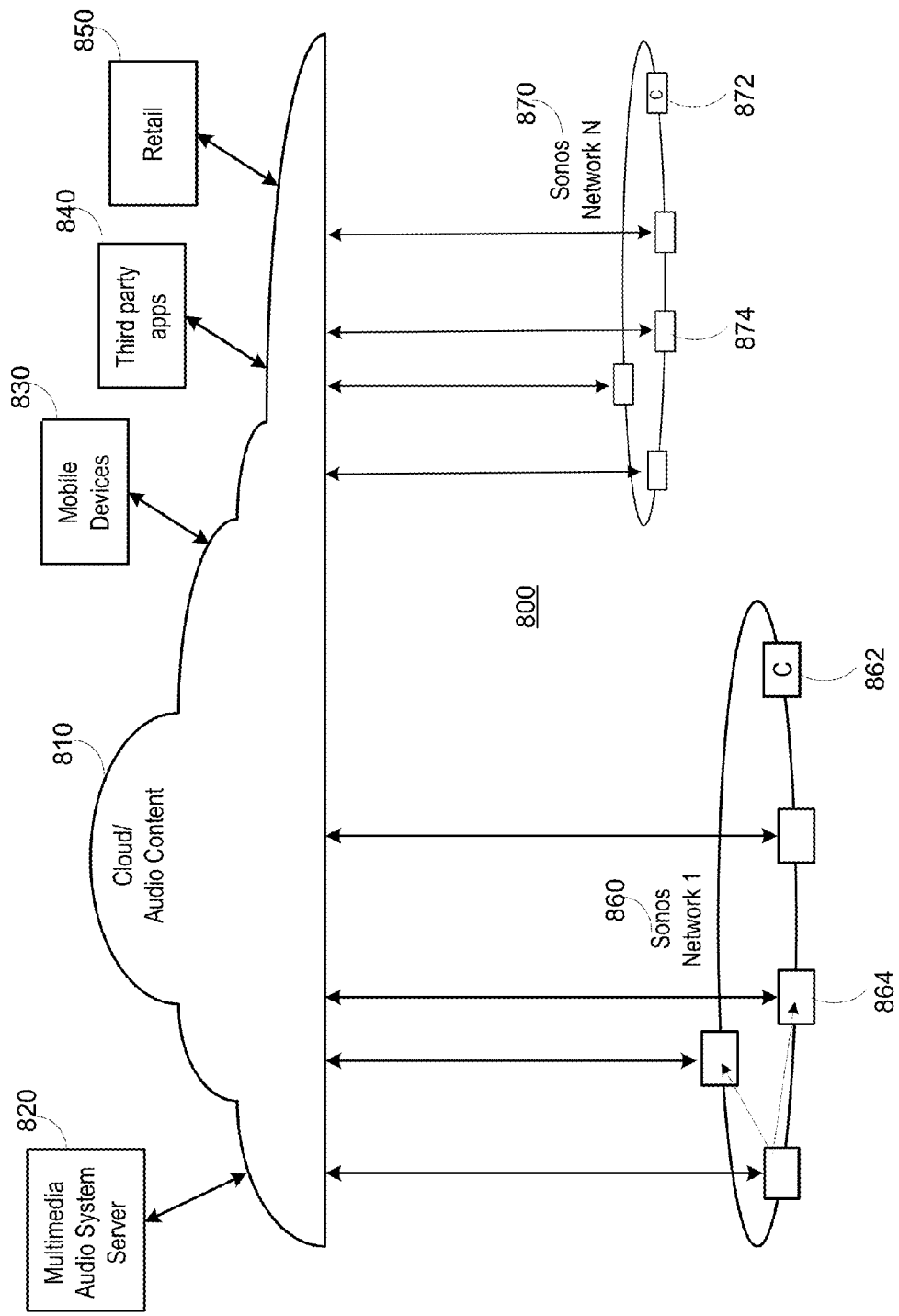
FIG. 8 shows a system including a plurality of networks including a cloud-based network and at least one local playback network.

FIG. 8 shows a system 800 including a plurality of interconnected networks including a cloud-based network and at least one local playback network. A local playback network includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 800 of FIG. 8, a plurality of content providers 820-850 can be connected to one or more local playback networks 860-870 via a cloud and/or other network 810. Using the cloud 810, a multimedia audio system server 820 (e.g., Sonos™), a mobile device 830, a third party application 840, a content provider 850 and so on can provide multimedia content (requested or otherwise) to local playback networks 860, 870. Within each local playback network 860, 870, a controller 862, 872 and a playback device 864, 874 can be used to playback audio content.

VIII. Example Proximity Sensing Configuration

As discussed above, embodiments described herein involve intelligently revealing selectable icons on a control panel of a playback device based on proximity detection. As indicated previously, a proximity sensor module may be configured to detect physical movement within a proximal range of the playback device, and based on the detected physical movement cause the selectable icons on the control panel to be illuminated and revealed. In some embodiments, the detection of physical movement within the proximal range of the playback device may indicate a user approaching the playback device, and accordingly, the selectable icons may be revealed for the user to view and potentially select.

Figure 9:
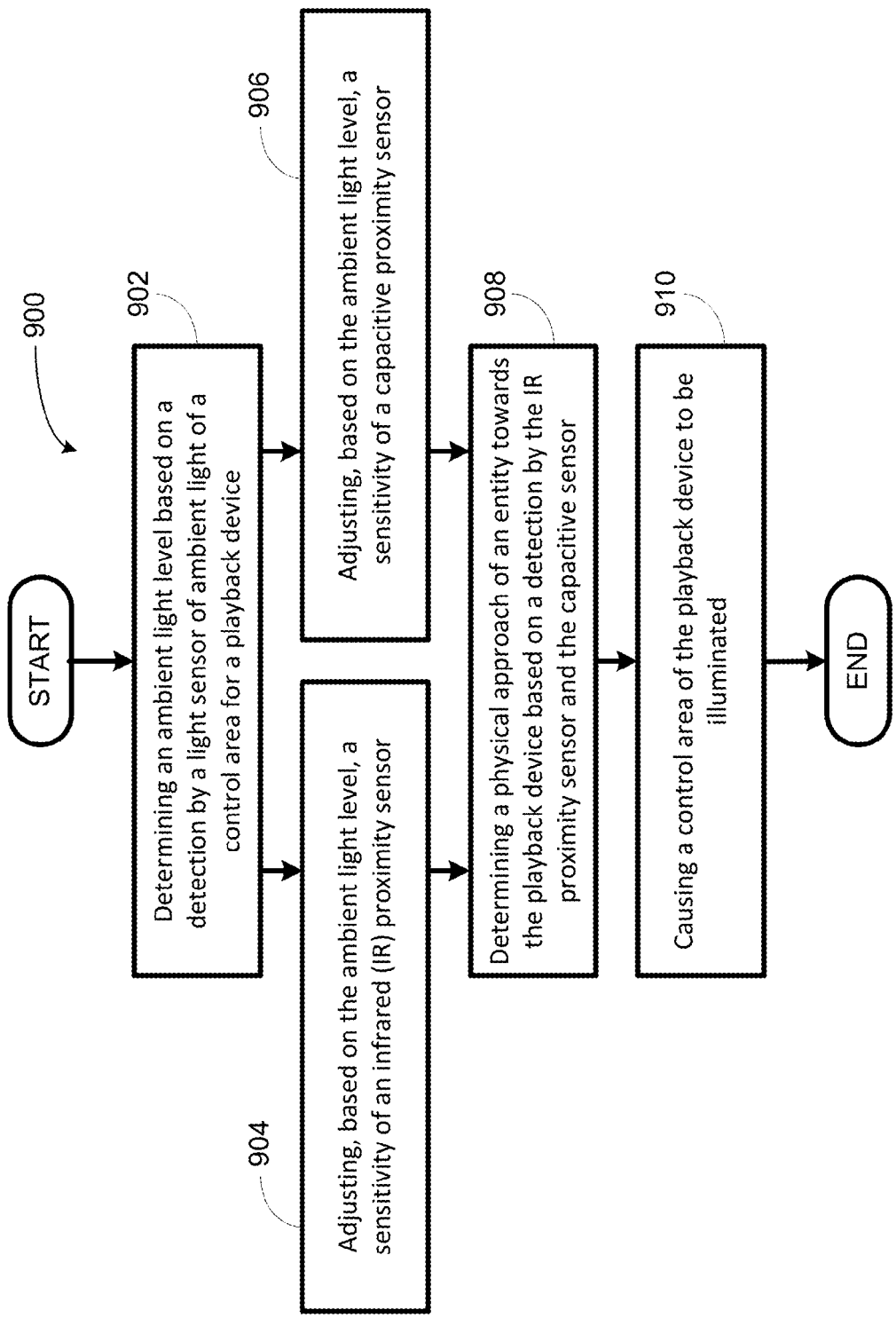
FIG. 9 shows an example flow diagram for configuring a proximity sensor module on a playback device.

FIG. 9 shows an example flow diagram for configuring a proximity sensor module on a playback device, in accordance with at least some embodiments described herein. Method 900 shown in FIG. 9 presents an embodiment of a method that could be used in the environments 100, 600, 700, and 800 with the systems 200, 202, 204, 300, 400, and 500 for example, in communication with one or more devices, such as those illustrated in FIGS. 2-5. Method 900 may include one or more operations, functions, or actions as illustrated by one or more of blocks 902-910. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 900 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 900 and other processes and methods disclosed herein, each block in FIG. 9 may represent circuitry that is wired to perform the specific logical functions in the process.

Figure 10:
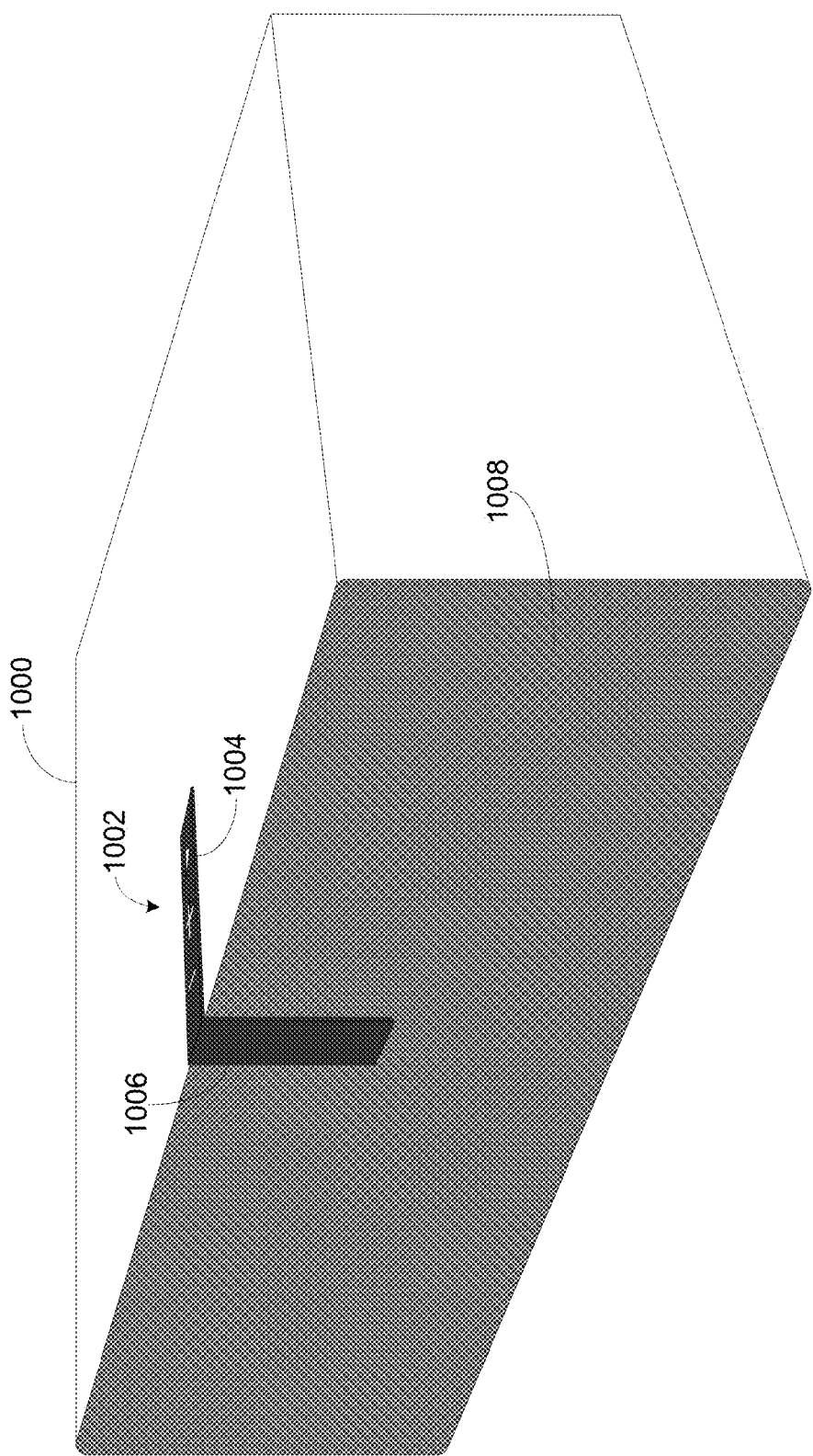
FIG. 10 shows an example playback device with a control panel.

At block 902, the method 900 may involve determining an ambient light level based on a detection by a light sensor of ambient light of a control area for a playback device. The control area might allow, for example, playback control for the playback device, such as "play," "pause," "volume up/down," and so on. FIG. 10 shows an example playback device 1000 that may be configured to intelligently reveal selectable icons on proximity detection. As shown, the playback device 1000 may include a control area 1002 around where proximity detecting capabilities may be implemented. The control area 1002 may include a control strip having selectable icons or buttons on a top portion 1004 of the control area 1002. In one example, the selectable icons may be capacitive buttons presented as back-lit icons. In some cases, if the top portion 1004 is a dark color, the icons may be effectively invisible when the icons are not illuminated. Also as shown, the control area 1002 further includes a front portion 1006 where a logo, such as a SONOS® may be provided. Further as shown, the playback device 1000 may include a speaker grille 1008.

In one example, a light sensor may be implemented on the playback device 1000 and configured to detect an ambient light level around the playback device 1000. More particularly, the light sensor may be configured to detect an ambient light level around the control area 1002 of the playback device 1000. In one case, the light sensor may be positioned within or adjacent to the control area 1002. The determined ambient light level, as will be further discussed below, may be based upon to refine the proximity detection capabilities of the playback device 1000 for the purposes of intelligently revealing the selectable icons on the top portion 1004 of the control area 1002.

Figure 11:
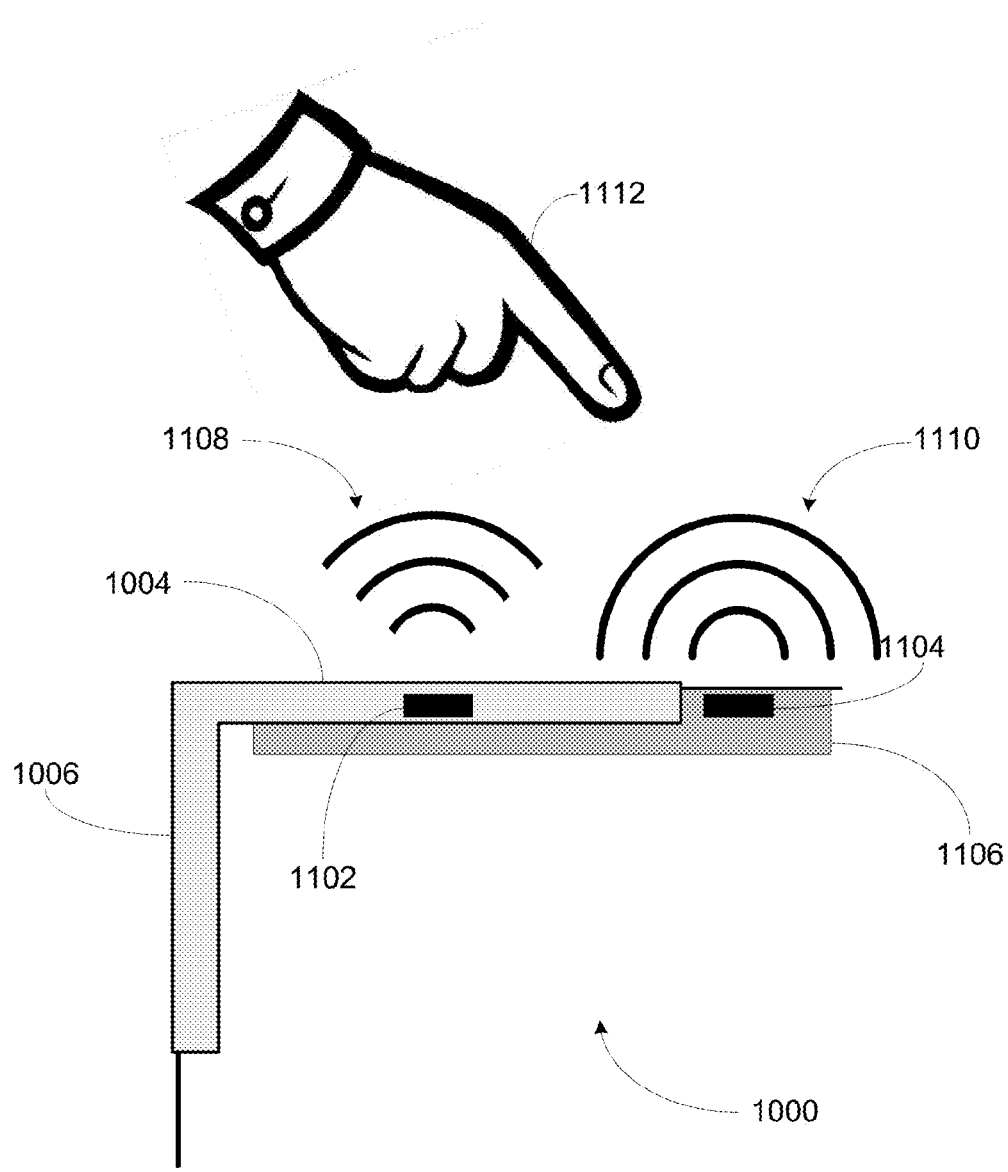
FIG. 11 shows an example configuration of an infrared (IR) sensor and a capacitive sensor implemented along a control panel.

FIG. 11 shows an example embodiment of the playback device 1000 with proximity sensing capabilities, including an IR sensor 1102 and a capacitive sensor 1104 implemented along the top portion 1004 of the control area 1002. The capacitive sensor 1104, as shown may have a capacitive grounding plane 1106. In discussions herein, the capacitive grounding plane 1106 may also be referred to as an electrode or metal electrode of the capacitive sensor 1104. In one case, the capacitive grounding plane 1106 may also be referred to as an antenna of the capacitive sensor 1104.

Both the IR proximity sensor and the capacitive sensor may be configured to detect physical movement, albeit via different mechanisms. As previously discussed, the capacitive sensor 1104 may be configured to detect a change in capacitance within a range of the capacitive grounding plane 1106, which in this case may be a range within a proximal vicinity above the control area 1002 of the playback device 1000. The IR sensor 1102 on the other hand, may be configured to emit infrared light pulses and detect reflected infrared light pulses to determine physical movement. In some embodiments, the IR sensor 1102 may further be configured as the light sensor for determining the ambient light level, as discussed above in connection to block 902.

As indicated above, if the playback device 1000 is located near a plasma television, the capacitive sensor 1104 may be falsely triggered while the plasma television is on, and a gain of the capacitive sensor 1104 may be reduced in the presence of the plasma television to reduce false triggers. However, reduced capacitive sensor gain may result in signals indicating the physical movement that are indistinguishable from a baseline noise signal for the capacitive sensor. Additional signal processing may be performed to better distinguish the signals, but may result in slower response times.

On the other hand, if the ambient light level of the playback device is high, the IR sensor may be flooded by the high ambient light level such that the IR sensor may not be able to reliably discern the reflected light pulses from the baseline ambient light. Accordingly, at block 904, the method 900 may involve adjusting, based on the ambient light level, a sensitivity of an infrared (IR) proximity sensor, and at block 906, the method 900 may involve adjusting, based on the ambient light level, a sensitivity of a capacitive proximity sensor.

In one example, adjusting the sensitivity of the capacitive proximity sensor may involve adjusting a gain level of the capacitive proximity sensor, and adjusting the sensitivity of the IR proximity sensor may involve adjusting a pulse width of the IR proximity sensor. In one instance, if the ambient light level is high, a gain of the capacitive sensor may be increased, and if the ambient light level is low, the gain of the capacitive sensor may be reduced. For the IR proximity sensor if the ambient light level is high, a dynamic range of the IR sensor may be reduced, and a pulse width of infrared light pulses generated from the IR sensor may be lengthened. Analogously, if the ambient light level is low, the dynamic range of the IR sensor may be increased, and the pulse width of infrared light pulses may be shortened.

As one having ordinary skill in the art may appreciate, different combinations of IR sensor dynamic ranges and infrared light pulse widths may be configured for different levels of ambient light, and different capacitive sensor gain levels may be configured for different levels of ambient light. In combination, when the ambient light level is high, the capacitive sensor may become more sensitive due to the increased gain level, while the IR sensor may become less sensitive due to the reduced dynamic range and increased infrared light pulse width. On the other hand, when the ambient light level is low, the capacitive sensor may become less sensitive due to the decreased gain level, while the IR sensor may become more sensitive due to the increased dynamic range and shorted infrared light pulse widths. As indicated above, different configurations of IR sensor and capacitive sensor sensitivities may be implemented for different levels of ambient light.

In an illustrative example, six combinations of capacitive sensor and IR sensor sensitivities may be implemented and configured depending on the determined ambient light level. In this example, the capacitive sensor 1104 may have three gain settings. The lowest gain settings, or "cap gain 1" may be configured such that false triggers are unlikely as long as the capacitive sensor 1104 is at least six inches away from a plasma display, as referred to above. In this setting, the capacitive sensor 1104 may have a range of about two to three inches. The next gain settings, or "cap gain 2" may be configured such that the capacitive sensor 1104 may have an additional inch or two of range. In this setting however, false triggers from the plasma display may occur if the plasma display is within six to eight inches away. The third gain setting, or "cap gain 3" may be configured such that the capacitive sensor 1104 may have a range up to about four inches, but may result in yet higher susceptibility to false triggers from the plasma display.

Further in this example, the IR sensor 1102 may have six settings. The first setting, or "IR setting 1," may have a minimal IR pulse width and short pulse integration time. In some cases, the IR sensor 1102 may have a high sensitivity mode and a low sensitivity mode, and at "IR setting 1" the IR sensor 1102 may be in high sensitivity mode. This setting may be suitable for a dark environment. Depending on the ambient light conditions, IR setting 1 may provide a range of about seven inches. As the settings progress to "IR setting 2," "IR setting 3," "IR setting 4," "IR setting 5," and "IR setting 6," the IR pulse width may increase incrementally, and the pulse integration time may increase accordingly. In one example, the IR sensor 1102 may be configured to be in the high sensitivity mode up to "IR setting 3," and at "IR setting 4," the IR sensor 1102 may be configured to switch to the low sensitivity mode, to accommodate the higher ambient light levels. As one having ordinary skill in the art will appreciate, higher ambient light levels may also include higher infrared light levels that may swamp the IR sensor 1102. In one case, an additional IR sensor, or IR sensor component of the IR sensor 1102 having a smaller receiving component for further reduced sensitivity may be provided to accommodate high ambient light levels. In such a case, settings, such as "IR setting 6" or even "IR setting 5" may involve switching to the IR sensor having the smaller receiving component. Other examples may also be possible.

In this illustrative example, "cap gain 1" may be paired with "IR setting 1," "IR setting 2," "IR setting 3," and "IR setting 4," "cap gain 2" may be paired with "IR setting 5," and "cap gain 3" may be paired with "IR setting 6." In other words, as previously suggested, as the capacitive sensor gain increases, the IR sensitivity decreases and the IR pulse widths and integration times increase. In some embodiments, the pairing of "cap gain 2" and "IR setting 5," and the paring of "cap gain 3" and "IR setting 6" may be configured for when the playback device 1000 is operating outdoors during the day. Other examples are also possible.

Referring back to the method 900, block 908 may involve determining a physical approach of an entity towards the playback device based on the detection of the physical movement by at least one of the IR proximity sensor and the capacitive proximity sensor. In other words, if either the IR sensor 1102 or capacitive sensor 1104 detects physical movement with the proximal range of the playback device 1000, a determination may be made that a user 1112 may be approaching the playback device and may wish to view the selectable icons before potentially selecting one or more of the selectable icons. To implement block 908, outputs from the IR sensor 1102 and the capacitive sensor 1104 may be processed through an "OR" function, and a physical approach of the entity towards the playback device may be determined based on the output of the "OR" function. Other examples are also possible.

At block 910, the method 900 may involve responsively causing a control area of the playback device to be illuminated. As suggested above, the back-lit icons on the control area 1002 of the playback device 1000 may be illuminated when either the IR sensor or the capacitive sensor detects the physical movement or presence of the user 1112 within the proximal range of the playback device. As such, responsive to the determination of the physical approach of the entity towards the playback device 1000, the selectable icons on the control area 1002 may be revealed.

In another embodiment, the selectable icons on the control area 1002 may be revealed after a presence of the user 1112 has been present within a distance of the control area for a predetermined period of time. For example, the control area 1002 may be configured to reveal the selectable icons if the user 1112 or a hand or finger of the user 1112 is within an inch or less from the control area for at least half a second. In some cases, such an implementation may reduce false triggers when the user 1112, or a pet of the user 1112 simply moves by the playback device 1000 within a proximal range from the control area 1002.

A similar approach may be implemented if any of the selectable icons on the control area 1002 represent a subset of additional icons selectable for the playback device to perform related functions. In such a case, if the user 1112 hovers over the selectable icon representative of the group of functions, the control area 1002 may, in response, reveal the subset of additional icons within the group. Other examples are also possible.

While the discussions above are directed to proximity detection for the purposes of revealing icons or buttons on the control panel of the playback device, one having ordinary skill in the art will appreciate that proximity detection may be utilized in other capacities as well. For instance, a playback device may pre-cache audio content in anticipation of a user providing input via the control panel to cause the playback device to playback audio content. In another instance, the playback device may be in an in-active state such that an amplifier of the playback device may be turned off to reduce power consumption while the playback device is not playing audio content. In this instance, the amplifier of the playback device may be turned on in anticipation of a user providing input via the control panel to cause the playback device to playback audio content based on proximity detection. Other examples are also possible.

As discussed above, embodiments described herein further involve configurations for improved off-axis or zero-degree approach detection of physical movement by the capacitive sensor. In addition to offering alternative proximity sensing capabilities in high ambient light conditions, the capacitive sensor may also compliment the IR sensor by providing additional off-axis detection. For instance, as shown in FIG. 11, the IR sensor 1102 may be positioned along the top portion 1004 of the control area 1002 of the playback device 1000 and accordingly, may have a detection range 1108 in a first direction directed to a space above the playback device 1000. In this case, an approach of the user 1112 from the front side of the playback device 1000 may not be as easily detected by the IR sensor. The capacitive sensor on the other hand, depending on the configuration of the capacitive grounding plane 1106, may be less directional and may have a detection range 1110 directed to the space above the playback device 100, as well as, to perhaps a lesser extent, spaces around the playback device 1000, even if the capacitive sensor 1104 is positioned along the top side of the playback device as well.

Figure 12A:
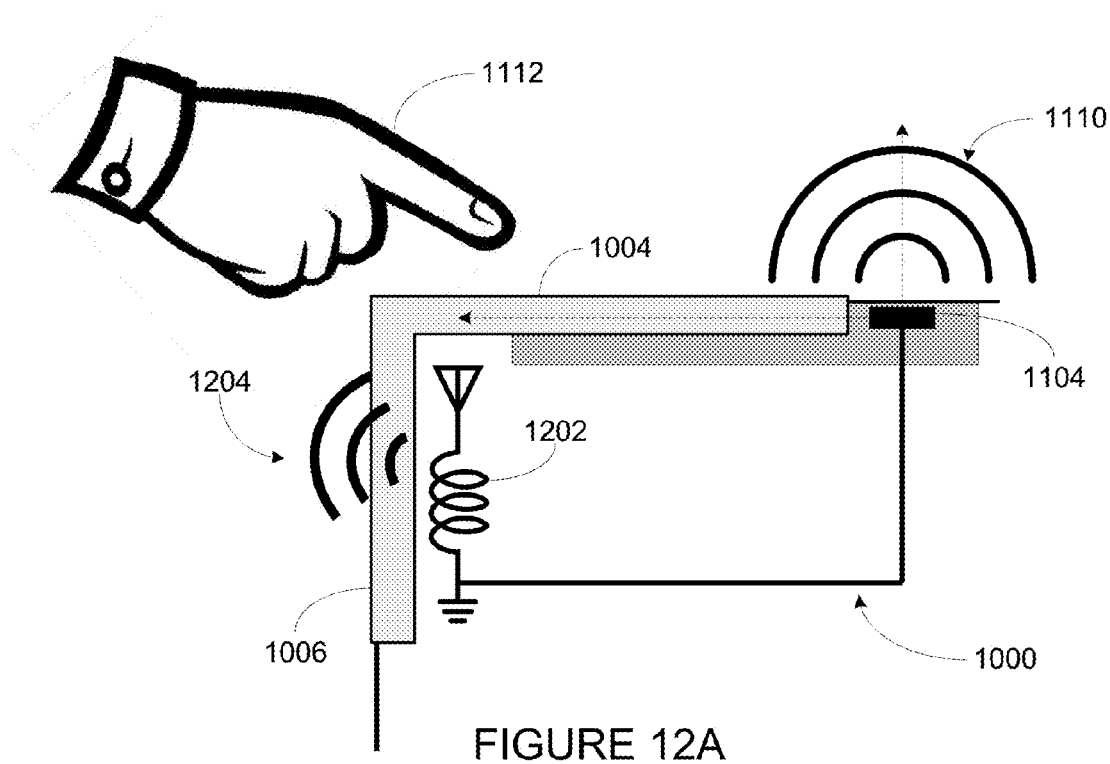
FIG. 12A shows a first example configuration of a capacitive sensor implemented along a control panel of a playback device.

In some embodiments of the present application, the off-axis, or zero-degree approach detection by the capacitive sensor 1104 may further be improved by coupling the capacitive grounding plane 1106, or an electrode of the capacitive sensor 1104 to other components of the playback device 1000. In one example, the playback device 1000 may be configured to communicate via wireless communication and may include an RF antenna component. FIG. 12A shows a first example configuration of the capacitive sensor 1104 implemented along the control panel 1002 of a playback device 1000. As shown, the capacitive sensor 1104 may be coupled to an RF antenna 1202 that is oriented orthogonally to the capacitive grounding plane 1106 of the capacitive sensor 1104. In one example, the RF antenna ground plane may be a copper pour in a printed circuit board.

In effect, coupling the ground plane of the RF antenna 1202 to the capacitive grounding plane 1106 of the capacitive sensor 1104 may provide an additional, second capacitive grounding plane for the capacitive sensor 1104. As such, in addition to the detection range 1110 as provided by the capacitive grounding plane 1106, the capacitive sensor 1104 may also have a detection range 1204. In this case, because the RF antenna 1202 may be oriented orthogonally to the capacitive grounding plane 1106, the detection range 1204 may be in a direction orthogonal, or 90 degrees to the direction of the detection range 1110. As shown, the detection range 1204 may be towards the front side of the playback device 1000. In other words, coupling the capacitive grounding plane 1106, or an electrode of the capacitive sensor 1104 to the ground plane of the RF antenna 1202 as described may improve the detection of physical movement in front of the playback device 1000 by the capacitive sensor 1104. Further in this case, the capacitive grounding plane 1106 may be capacitively coupled to the ground plane of the RF antenna 1202, such that performance of the RF antenna 1202 may be enhanced because the capacitive grounding plane 1106 may act as an RF ground for additional noise isolation for the RF antenna 1202.

In other embodiments, the RF antenna 1202 may be oriented at any relative angle to the capacitive grounding plane 1106. In such cases, the detection of physical movement by the capacitive sensor 1104 may be improved in a direction at the relative angle to the detection direction of the capacitive grounding plane 1106. Other examples are also possible.

Figure 12B:
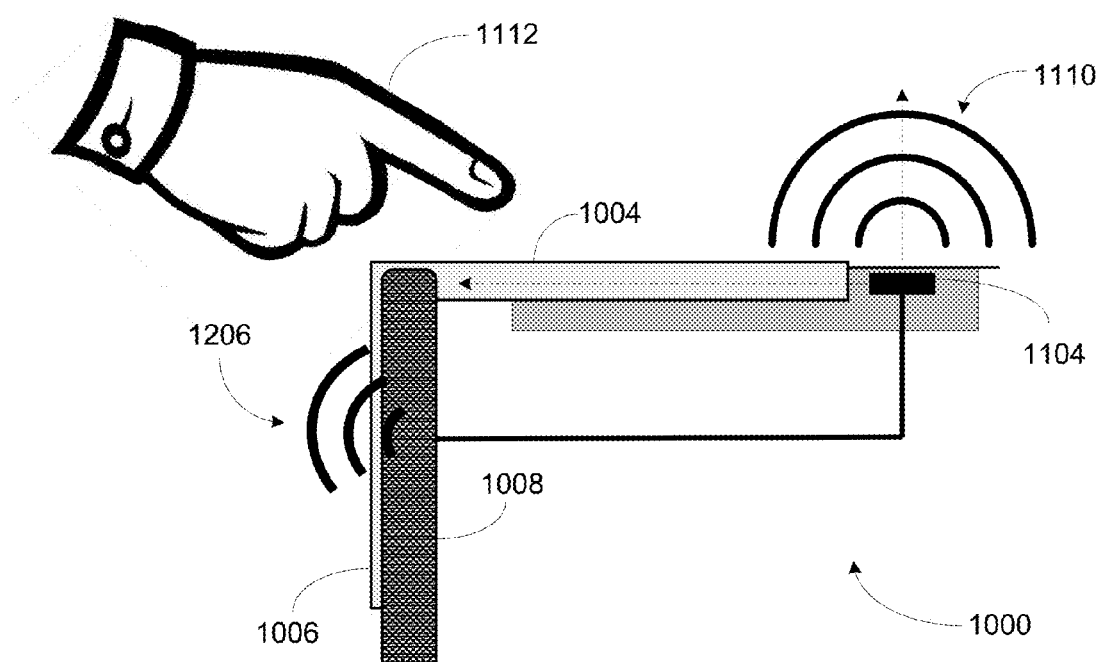
FIG. 12B shows a second example configuration of a capacitive sensor implemented along a control panel of a playback device.

In addition to the RF antenna 1202, the off-axis, or zero-degree approach detection by the capacitive sensor 1104 may further be improved by coupling the capacitive grounding plane 1106, or an electrode of the capacitive sensor 1104 to the speaker grille 1008 of the playback device 1000. FIG. 12B shows a second example configuration of the capacitive sensor 1104 implemented along the control panel 1002 of the playback device 1000, and coupled to the speaker grille 1008. In one example, the speaker grille 1008 may be a metal speaker grille. Similar to the case described above in connection to the RF antenna 1202, the speaker grille 1008 may provide the capacitive sensor 1104 a second capacitive grounding plane, which in this case, may also be substantially orthogonal to the capacitive grounding plane 1106, on the front side of the playback device 1000. In this case, the second capacitive grounding plane may provide the capacitive sensor 1104 with a detection range 1206, substantially orthogonal to the detection range 1110. Accordingly, coupling the capacitive grounding plane 1106, or an electrode of the capacitive sensor 1104 to the speaker grille may also improve the detection of physical movement in front of the playback device 1000 by the capacitive sensor 1104.

In such a configuration, however, playback of audio by the playback device 1000 may generate sufficient change in capacitance detectable by the speaker grille and cause false triggers in the capacitive sensor 1104. This may occur, for example, if the diaphragm of the speaker is metal. As such, in one embodiment, the speaker grille and the capacitive grounding plane 1106 may be coupled when the playback device is not playing audio content, and decoupled when the playback device is playing audio content.

In implementation, the playback device 1000 may be configured to determine that the playback device is not rendering audio content, and responsively cause the capacitive grounding plane 1106 of the capacitive sensor 1104 to be coupled to the speaker grille 1008 of the playback device 1000. On the other hand, the playback device 1000 may be configured to determine that the playback device 1000 is or will be rendering audio content, and responsively, cause the capacitive grounding plane 1106 of the capacitive sensor 1104 to be decoupled from the speaker grille 1008 of the playback device 1000, if the capacitive grounding plane 1106 and the speaker grille 1008 was previously coupled.

In some embodiments, the capacitive grounding plane 1106 may be coupled to both the RF antenna 1202 and the speaker grille 1008 such that the capacitive sensor 1104 has three capacitive grounding planes. In one case, the capacitive grounding plane 1106 may be coupled to the RF antenna 1202 and not to the speaker grille 1008 when audio content is being played by the playback device 1000, while the capacitive grounding plane 1106 may be coupled to both the RF antenna 1202 and the speaker grille 1008 when audio content is not being played by the playback device 1000. Other examples and configurations may also be possible.

As discussed previously, proximity detection may be utilized in other capacities as well, in addition to the intelligent revealing of selectable icons. Depending on the application of proximity detection, various combinations of coupling or decoupling between the capacitive grounding plane 1106 and the RF antenna 1202 and speaker grille 1008 may be implemented as applicable.

IX. Conclusion

The descriptions above disclose various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

As indicated above, the present application involves intelligently revealing selectable icons on a control panel of a playback device based on proximity detection. In one aspect, a method is provided. The method involves determining an ambient light level based on a detection by a light sensor of ambient light of a control area for a playback device, and adjusting, based on the ambient light level, a sensitivity of an infrared (IR) proximity sensor. The IR proximity sensor is configured to detect physical movement. The method further involves adjusting, based on the ambient light level, a sensitivity of a capacitive proximity sensor. The capacitive proximity sensor is configured to detect a physical movement. The method also involves determining a physical approach of an entity towards the playback device based on the detection of the physical movement by at least one of the IR proximity sensor and the capacitive proximity sensor, and responsively causing a control area of the playback device to be illuminated.

In another aspect, a device is provided. The device includes a processor, an infrared (IR) proximity sensor, a capacitive proximity sensor, and memory having stored thereon instructions executable by the processor to cause the playback device to perform functions. The functions include determining an ambient light level of a control area for a playback device based on a detection by a light sensor, and adjusting, based on the ambient light level, a sensitivity of an infrared (IR) proximity sensor. The IR proximity sensor is configured to detect physical movement. The functions further include adjusting, based on the ambient light level, a sensitivity of a capacitive proximity sensor. The capacitive proximity sensor is configured to detect a physical movement. The functions further include determining a physical approach of an entity towards the playback device based on the detection of the physical movement by at least one of the IR proximity sensor and the capacitive proximity sensor, and responsively causing a control area of the playback device to be illuminated.

In yet another aspect, a non-transitory computer readable memory is provided. The non-transitory computer readable memory has stored thereon instructions executable by a computing device to cause the computing device to perform functions. The functions include determining an ambient light level of a control area for a playback device based on a detection by a light sensor, and adjusting, based on the ambient light level, a sensitivity of an infrared (IR) proximity sensor. The IR proximity sensor is configured to detect physical movement. The functions also include adjusting, based on the ambient light level, a sensitivity of a capacitive proximity sensor. The capacitive proximity sensor is configured to detect a physical movement. The functions further include determining a physical approach of an entity towards the playback device based on the detection of the physical movement by at least one of the IR proximity sensor and the capacitive proximity sensor, and responsively causing a control area of the playback device to be illuminated.

Additionally, references herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

We claim:

1. A playback device comprising:
a wireless communications interface that includes an RF antenna;
a capacitive proximity sensor comprising a grounding plane that is coupled to the RF antenna;
one or more processors; and
a data storage having stored therein instructions executable by the one or more processors to cause the playback device to perform operations comprising:
detecting that an object is in proximity to the capacitive proximity sensor; and
responsively preparing the playback device to play back audio.

2. The playback device of claim 1, wherein the RF antenna comprises a copper pour in a printed circuit board.

3. The playback device of claim 1, wherein responsively preparing the playback device to play back audio comprises responsively causing a control area of the playback device to be illuminated.

4. The playback device of claim 1, wherein responsively preparing the playback device to play back audio comprises:
streaming audio content via the wireless communications interface; and
caching the streamed audio content in a data storage of the playback device.

5. The playback device of claim 1, wherein responsively preparing the playback device to play back audio comprises responsively enabling an audio stage of the playback device such that an amplifier component of the audio stage is configured to produce amplified audio signals.

6. The playback device of claim 1, wherein the capacitive proximity sensor is mounted adjacent to a first side of the playback device so as to provide proximity detection in a first direction, and wherein the RF antenna is mounted adjacent to a second side of the playback device so as to provide proximity detection in a second direction that is different from the first direction.

7. The playback device of claim 6, wherein the first side of the playback device is a top surface of the playback device, and wherein the second side of the playback device is a front side of the playback device that is orthogonal to the top surface.

8. The playback device of claim 1, wherein the playback device further comprises a conductive speaker grille and wherein the operations further comprise:
causing the grounding plane of the capacitive proximity sensor to be coupled to the conductive speaker grille.

9. The playback device of claim 8, wherein the operations further comprise:
determining that the playback device will be rendering audio; and
responsively causing the grounding plane of the capacitive proximity sensor to be decoupled from the conductive speaker grille while the playback device is rendering audio.

10. The playback device of claim 9, wherein the operations further comprise:
determining that the playback device has stopped rendering audio; and
responsively causing the grounding plane of the capacitive proximity sensor to be coupled to the conductive speaker grille.

11. The playback device of claim 9, wherein the conductive speaker grille is mounted on a first side of the playback device so as to provide proximity detection in a first direction, and wherein the RF antenna is mounted adjacent to a second side of the playback device so as to provide proximity detection in a second direction that is different from the first direction.

12. The playback device of claim 9, wherein the conductive speaker grille is mounted on a front side of the playback device so as to provide proximity detection in a given direction, and wherein the RF antenna is mounted adjacent to the front side of the playback device so as to provide proximity detection in the given direction.

13. The playback device of claim 9, wherein the wireless communications interface comprises one or more of: a wireless network interface or a Bluetooth interface.

14. A playback device comprising:
a wireless communications interface that includes an RF antenna;

a capacitive proximity sensor comprising a grounding plane that is coupled to the RF antenna; and a control system that detects that an object is in proximity to the capacitive proximity sensor and responsively prepares the playback device to play back audio.

15. The playback device of claim 14, wherein the RF antenna comprises a copper pour in a printed circuit board.

16. The playback device of claim 14, wherein responsively preparing the playback device to play back audio comprises responsively causing a control area of the playback device to be illuminated.

17. The playback device of claim 16, wherein responsively preparing the playback device to play back audio comprises responsively enabling an audio stage of the playback device such that an amplifier component of the audio stage is configured to produce amplified audio signals.

18. The playback device of claim 16, wherein the playback device further comprises a conductive speaker grille, and wherein the control system anticipates that the playback device will be rendering audio and responsively causes the grounding plane of the capacitive proximity sensor to be decoupled from the conductive speaker grille while the playback device is rendering audio.

19. The playback device of claim 18, wherein the control system determines that the playback device has stopped rendering audio and responsively causes the grounding plane of the capacitive proximity sensor to be coupled to the conductive speaker grille.

20. A capacitive sensing system comprising:

a capacitive proximity sensor that includes a grounding plane, wherein the grounding plane is oriented so as to sense proximity in a first direction; and a wireless communications interface that includes an RF antenna, wherein the RF antenna is coupled to the grounding plane, and wherein the RF antenna is oriented so as to sense proximity in a second direction that is different from the first direction.

* * * * *